(12) United States Patent
Shinjo et al.

(10) Patent No.: US 7,857,140 B2
(45) Date of Patent: Dec. 28, 2010

(54) SEMICONDUCTOR WAFER STORAGE CASE AND SEMICONDUCTOR WAFER STORING METHOD

(75) Inventors: Yoshiaki Shinjo, Kawasaki (JP); Yuzo Shimobeppu, Kawasaki (JP); Kazuo Teshirogi, Kawasaki (JP); Kazuhiro Yoshimoto, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 7 days.

(21) Appl. No.: 12/131,296

(22) Filed: Jun. 2, 2008

(65) Prior Publication Data

US 2008/0230438 A1    Sep. 25, 2008

Related U.S. Application Data

(63) Continuation of application No. PCT/JP2005/022360, filed on Dec. 6, 2005.

(51) Int. Cl.
*B65D 85/00*    (2006.01)
(52) U.S. Cl. .................. 206/711; 206/832; 206/454; 206/445; 206/710; 229/67.3; 211/41.18
(58) Field of Classification Search ......... 206/710–712, 206/445, 832, 833, 449–456; 229/101, 117, 229/117.01, 67.3, 928; 211/41.18
See application file for complete search history.

(56) References Cited

U.S. PATENT DOCUMENTS 2,725,087 A * 11/1955 Potter .......................... 206/598
3,391,698 A * 7/1968 Wiles ........................... 220/500
5,314,068 A * 5/1994 Nakazato et al. ............. 206/454
5,353,934 A * 10/1994 Yamauchi .................... 206/454
5,743,409 A * 4/1998 Nakahara et al. ............ 206/710
5,749,469 A * 5/1998 Williams .................... 206/710
6,092,981 A * 7/2000 Pfeiffer et al. .............. 414/810
6,981,594 B1 * 1/2006 Sarver ........................ 206/710
7,325,692 B2 * 2/2008 Nanjo ......................... 206/710
7,501,370 B2 * 3/2009 Narendar et al. .............. 501/88

FOREIGN PATENT DOCUMENTS

| JP | 55-55963 A | 4/1980 |
| JP | 6-85046 A | 3/1994 |
| JP | 7-161805 A | 6/1995 |
| JP | 2000-355392 A | 12/2000 |
| JP | 2002-305239 A | 10/2002 |

OTHER PUBLICATIONS

International Search Report of PCT/JP2005/022360, date of mailing Mar. 14, 2006.

* cited by examiner

*Primary Examiner*—Mickey Yu
*Assistant Examiner*—Chun Cheung
(74) *Attorney, Agent, or Firm*—Westerman, Hattori, Daniels & Adrian, LLP

(57) ABSTRACT

A semiconductor wafer storage case is disclosed that includes plural support members that are spaced at predetermined intervals with respect to each other and are each configured to come into contact with a peripheral edge region of a first face of a semiconductor wafer, and an elastic member that elastically supports the support members with respect to each other and is configured to elastically deform to come into contact with a second face of the semiconductor wafer and press the semiconductor wafer onto a corresponding support member.

4 Claims, 20 Drawing Sheets

SEMICONDUCTOR WAFER STORAGE CASE AND SEMICONDUCTOR WAFER STORING METHOD

CROSS REFERENCE TO RELATED APPLICATIONS

This application is a U.S. continuation application filed under 35 USC 111(a) claiming benefit under 35 USC 120 and 365(c) of PCT application JP2005/022360, filed Dec. 6, 2005, the entire contents of which are hereby incorporated by reference.

BACKGROUND OF THE INVENTION

1. Field of the Invention

The present invention relates to a semiconductor wafer storage case used for transporting or storing a semiconductor wafer, and a method of storing a semiconductor wafer.

2. Description of the Related Art

In view of the growing demand for miniaturization of a semiconductor package, techniques are being developed for reducing the thickness of a semiconductor wafer. However, a semiconductor wafer with reduced thickness may easily break when it is transported or stored in the conventional manner. Thus, new techniques for safely storing a semiconductor wafer are currently in demand.

A storage case having slit portions arranged at predetermined intervals is normally used upon transporting or storing a semiconductor wafer. Such a storage case may be configured to store up to twenty-five (25) semiconductor wafers, for example. Another exemplary storage case may be configured to store plural semiconductor wafers that are stacked one on top of the other with interlayer sheets inserted therebetween. Other various storage cases have been proposed for transporting or storing plural semiconductor wafers, such as those described in Japanese Laid-Open Patent Publication No. 6-085046, Japanese Laid-Open Patent Publication No. 2000-355392, and Japanese Laid-Open Patent Publication No. 7-161805.

As is described above, techniques for reducing the thickness of a semiconductor wafer are being developed in response to the demand for a miniaturized semiconductor package. For example, a semiconductor wafer previously having a thickness of approximately 0.7 mm may now be reduced to have a thickness of approximately 0.05 mm.

A conventional semiconductor wafer storage case has grooves (or slit portions) arranged at its inner side at predetermined intervals. Semiconductor wafers are held within these grooves and stored in such a storage case. The storage case is normally configured to store unprocessed semiconductor wafers (e.g., semiconductor wafers having a thickness of approximately 0.7 mm), and accordingly, its inner side has grooves arranged at approximately 1-2 mm intervals.

It is noted that a conventional semiconductor wafer storage case does not have a structure for holding the peripheral edge portion of a semiconductor wafer in place. Although such a storage case may have versatility, when such a conventional semiconductor storage case is used for storing or transporting semiconductor wafers with reduced thickness, there may be a relatively high risk of the semiconductor wafers being damaged. Specifically, the semiconductor wafers may be prone to break due to vibrations and shock created during its transportation, for example.

FIGS. 1A-1C are diagrams showing an exemplary conventional extensible storage case. Specifically, FIG. 1A is a cross-sectional view of the extensible storage case when it is expanded. FIG. 1B is a cross-sectional view of the extensible storage case when it is compressed. FIG. 1C is a perspective view of the extensible storage case.

As is shown in FIG. 1C, the illustrated storage case 4 is arranged into a concertina structure having openings at its front face side and rear face side and a suitable stopper member (not shown) arranged at the rear face side opening. Plural slit portions 6 are arranged at predetermined intervals on the left side wall and the right side wall extending between the upper face 2 and lower face 3 of the storage case 4. A handgrip 5 for holding the storage case 4 is arranged on the upper face 2 of the storage case 4. Each of the slit portions 6 has an upper oblique face 6a and a lower oblique face 6b.

In the following, storing or transporting a semiconductor wafer 1 with reduced thickness using the above-described extensible storage case 4 is described.

As is shown in FIG. 1A, the semiconductor wafer 1 that has been reduced in thickness by a back grinding process has a relatively sharp wafer edge. When this semiconductor wafer 1 is inserted into one of the slit portions 6, the wafer edge only comes into contact with the lower oblique face 6b of the slit portion 6.

When storing or transporting the semiconductor wafer 1, an external force is applied to the storage case 4 so that the storage case 4 may be compressed as is shown in FIG. 1B. In this case, the semiconductor wafer 1 may easily break when it is stored or transported.

Such a problem occurs due to the fact that an R-shaped portion of the periphery of the semiconductor wafer 1 is reduced to half of its original thickness. Specifically, in the process of reducing the thickness of the semiconductor wafer 1, the wafer edge of the semiconductor wafer 1 becomes sharp so that it may easily break even when a small external force is exerted thereon.

Also, the storage case 4 is relatively tall and has a relatively large volume so that the storage case 4 takes up space and may not be convenient cost-wise for being transported to a different location, for example. Accordingly, measures are desired for reducing the size of the storage case itself.

In view of the above-described problems, a stacking type storage case has been developed that stacks plural semiconductor wafers one on top of the other with interlayer sheets inserted between the stacked semiconductor wafers.

However, with such a configuration, the side face of the semiconductor wafer comes into contact with the inner wall of the storage case so that problems such as damage of the semiconductor wafer may not be adequately prevented when such a storage case is used for storing the semiconductor wafer 1 with reduced thickness.

Also, Japanese Laid-Open Patent Publication No. 7-161805 discloses a concertina type extensible case that is configured to protect the semiconductor wafer accommodated therein from damage during its transportation. However, the disclosed storage case cannot adequately protect a semiconductor wafer having a sharp wafer edge from breaking as is described in detail below with reference to FIG. 2.

In FIG. 2, the dotted line represents a pre-ground face (bottom face) 1d of the semiconductor wafer 1 before a back grinding process is performed thereon to reduce its thickness. It is noted that the distance from a patterned face 1a (upper face) to the pre-ground face 1d corresponds to the original thickness of the semiconductor wafer 1.

The back grinding process is performed on the semiconductor wafer 1 so that the pre-ground face 1d is ground to the solid line (ground face 1b) shown in FIG. 2. In this case, the thickness of the semiconductor wafer 1 corresponds to a distance between the patterned face 1a and the ground face 1b corresponding to the solid line shown in FIG. 2. By performing such a back grinding process, the thickness of the R-shaped portion of the periphery of the semiconductor wafer 1 is reduced to less than or equal to half its original thickness. Accordingly, the edge of the semiconductor wafer 1 is arranged into a sharp wafer edge 1c.

As is described above with respect to FIG. 1A, when the semiconductor wafer 1 with reduced thickness is inserted into the slit portion 6 of the storage case 4, the edge of the semiconductor wafer 1 is supported only by the lower oblique face 6b. In this case, since the lower oblique face 6b of the slit portion 6 is slanted, the edge of the semiconductor wafer 1 comes into linear contact with the lower oblique face 6b so that the semiconductor wafer 1 may easily break or be damaged.

Further, when the storage case 4 is compressed in order to hold the semiconductor wafer 1 in place, the vertical direction pressing force applied to the storage case 4 may be focused on the edge of the semiconductor wafer 1 to thereby increase its risk of breaking.

SUMMARY OF THE INVENTION

According to one aspect of an embodiment, a semiconductor wafer storage case is provided that includes:

support members that are spaced at predetermined intervals with respect to each other, each of which support members is configured to come into contact with a peripheral edge region of a first face of a semiconductor wafer; and an elastic member that elastically supports the support members with respect to each other, which elastic member is configured to elastically deform to come into contact with a second face of the semiconductor wafer and press the semiconductor wafer onto a corresponding support member of the support members.

According to another aspect of the embodiment, a semiconductor wafer storage case is provided that includes:

support members that are spaced at predetermined intervals with respect to each other, each of which support members has a semiconductor wafer support face that comes into contact with a peripheral edge region of a first face of a semiconductor wafer;

a damper that is arranged on another face of each of the support members which clamper is configured to come into contact with a second face of the semiconductor wafer and press the semiconductor wafer onto a corresponding support member of the support members; and an elastic member that elastically supports the support members with respect to each other.

According to the other aspect of the embodiment, a semiconductor wafer storing method is provided for storing a semiconductor wafer using one of the semiconductor wafer storage cases according to the above-described embodiments, the method including the steps of:

inserting one or more semiconductor wafers into one or more of the spaces between the support members when the semiconductor wafer storage case is expanded; and compressing the semiconductor wafer storage case in a manner such that the peripheral edge region of the first face of each of the semiconductor wafers comes into contact with the corresponding support member and the elastic member elastically deforms to press each of the semiconductor wafers onto the corresponding support member.

According to the other aspect of the embodiment, a semiconductor wafer storage case is provided that includes:

a continuous V-shaped spring member having plural V-shaped portions each configured to accommodate a semiconductor wafer; and a damper that is configured to press the semiconductor wafer and is arranged at a contact location of the continuous V-shaped spring member that comes into contact with the semiconductor wafer.

According to another embodiment of the present invention, a semiconductor wafer storing method is provided for storing a semiconductor wafer using the semiconductor wafer storage case according to the above-described embodiment, the method comprising the steps of:

inserting one or more semiconductor wafers into one or more of the V-shaped portions of the continuous V-shaped spring member when the semiconductor wafer storage case is expanded; and compressing the semiconductor wafer storage case in a manner such that each peripheral edge region of a first face and a second face of each of the semiconductor wafers comes into contact with and is supported by the clamper.

DESCRIPTION OF THE PREFERRED EMBODIMENTS

In the following, preferred embodiments of the present invention are described with reference to the accompanying drawings.

A semiconductor wafer storage case 10A according to a first embodiment of the present invention is described below with reference to FIGS. 3 through 12.

Figure 3:
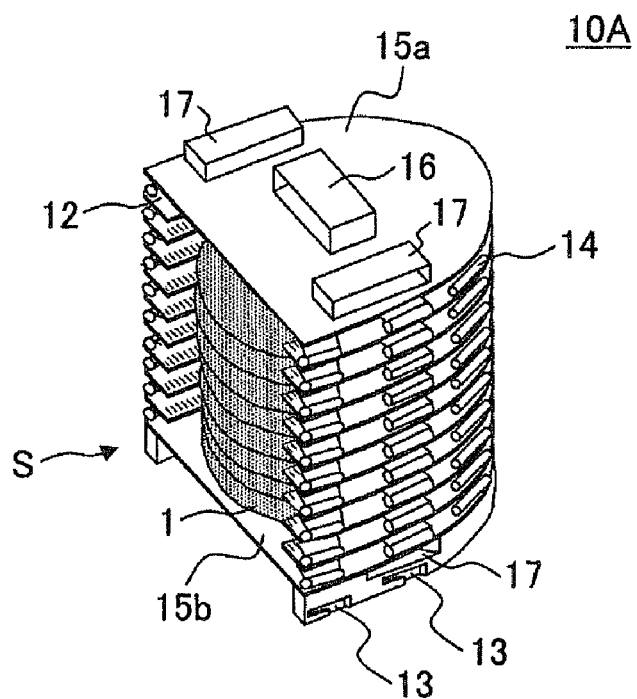
FIG. 3 is a perspective view of a semiconductor wafer storage case according to a first embodiment of the present invention when it is expanded.
Figure 4:
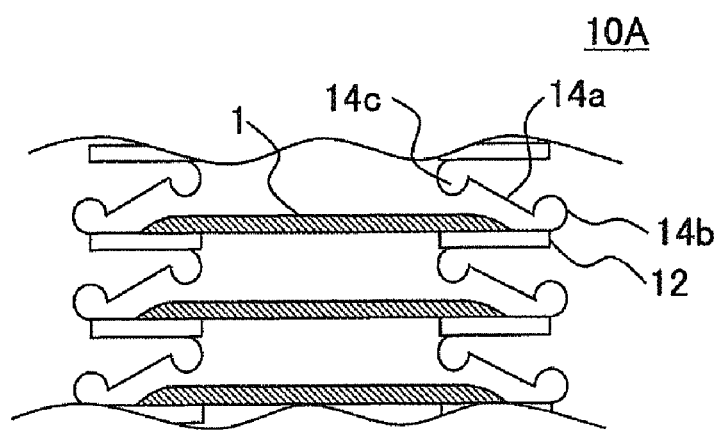
FIG. 4 is a cross-sectional view of the storage case according to the first embodiment in the expanded state as shown in FIG. 3.

FIG. 3 is a perspective view of the storage case 10A according to the first embodiment when it is expanded. FIG. 4 is a cross-sectional view of the storage case 10A in the expanded state as shown in FIG. 3.

The storage case 10A according to the present embodiment may be expanded and compressed. The storage case 10A includes plural U-shaped plates 12 as semiconductor wafer support members.

The U-shaped plates 12 as the semiconductor wafer support members form an opening at the front side (open portion of the U-shape structure) of the storage case 10A for enabling insertion of a semiconductor wafer. Also, plural spring members 14 are arranged at the rear side (the U-shape periphery) of the storage case 10A.

Specifically, the U-shaped plates 12 are coupled to each other and supported by plural spring members 14 corresponding to elastic members that are arranged along the U-shape periphery of the U-shaped plates 12. The space between the U-shaped plates 12 when the storage case 11A is not compressed may be approximately 5 mm.

It is noted that in certain embodiments, the linear portions and curved portions of the U-shaped plates 12 may be substantially sealed depending on the number of spring members 14.

The storage case 10A according to the present embodiment has a case upper plate 15a and a case lower plate 15b that are respectively arranged above the uppermost U-shaped plate 12 and below the lowermost U-shaped plate 12 via the spring members 14. A handgrip 16 for holding the storage case 10A and expanded/compressed case fixing holes 17 for fixing the storage case 10A in the expanded/compressed state are arranged on the surface of the case upper plate 15a. Also, expanded/compressed case fixing holes 17 and apparatus fixing holes 13 are arranged on the case lower plate 15b.

As is shown in FIG. 4, the side wall of the storage case 10A according to the present embodiment is formed by stacking the U-shaped plates 12 and the spring members 14 at predetermined intervals.

The U-shaped plate 12 is arranged to have outer dimensions that are greater than the outer dimensions of the semiconductor wafer 1, and the rear side portion of the U-shaped plate 12 (i.e., opposite side of the semiconductor wafer insertion opening) is arranged into a semi-circular shape in accordance with the outer shape of the semiconductor wafer 1.

Figure 1A:
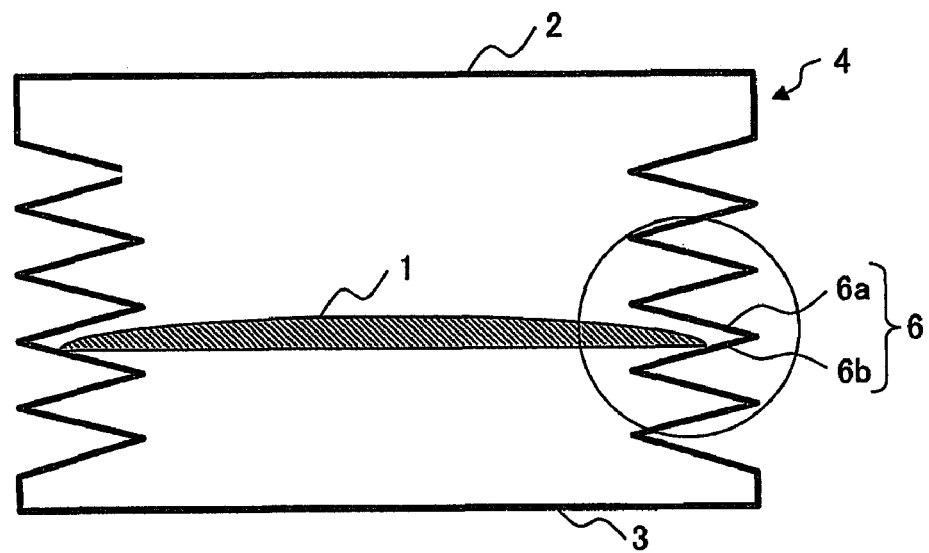
FIG. 1A is a cross-sectional view of a conventional extensible semiconductor wafer storage case when it is expanded.
Figure 1B:
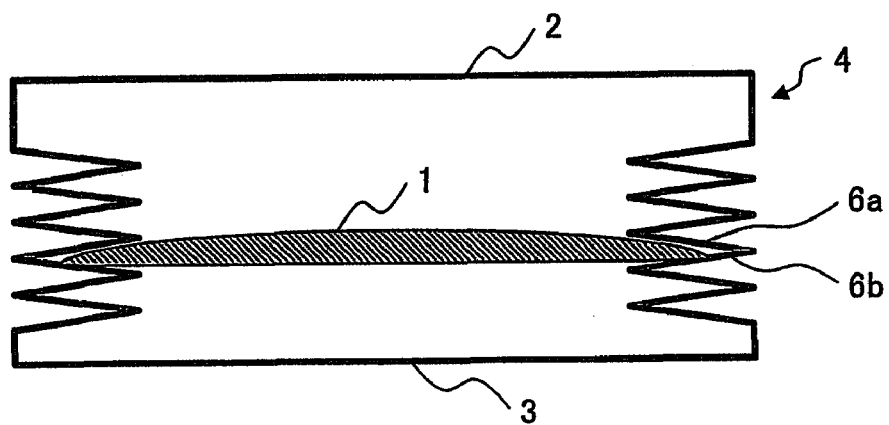
FIG. 1B is a cross-sectional view of a conventional extensible semiconductor wafer storage case when it is compressed.
Figure 1C:
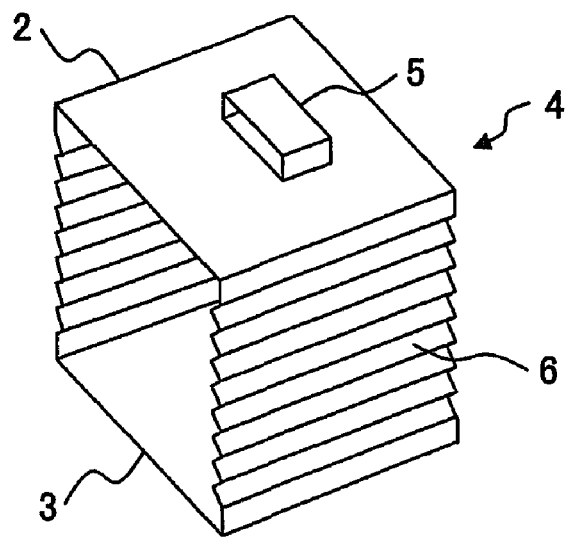
FIG. 1C is a perspective view of the conventional extensible semiconductor wafer storage case.
Figure 2:
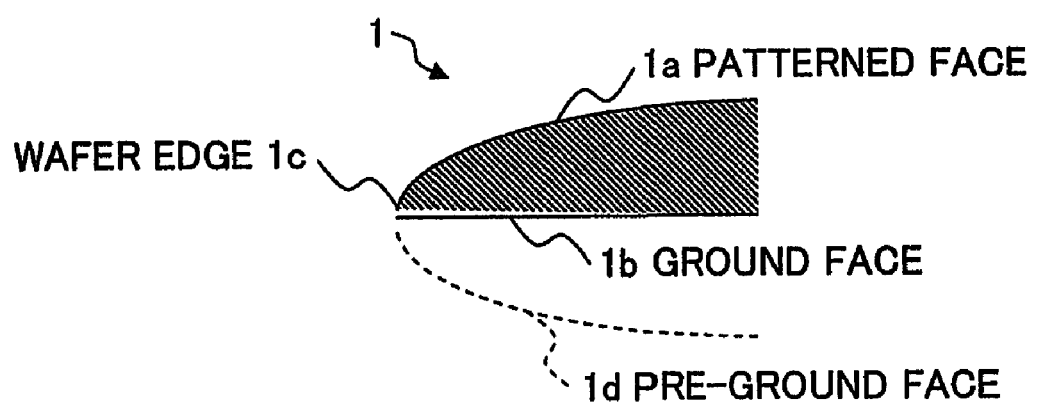
FIG. 2 is a cross-sectional view of a semiconductor wafer.

It is noted that by arranging the storage case 10A according to the present embodiment to have the above-described configuration, its storage space may be reduced compared to that of the storage case 4 shown in FIG. 1C.

Figure 5:
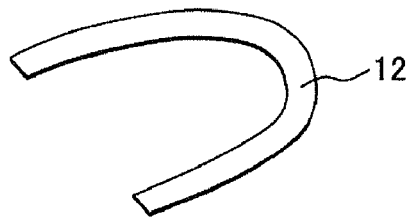
FIG. 5 is a perspective view of a U-shaped plate used in the semiconductor wafer storage case according to the first embodiment.

FIG. 5 is a perspective view of the U-shaped plate 12 used in the storage case 10A according to the present embodiment.

The U-shaped plate 12 used in the present embodiment is a plate member made of hard resin or metal that is processed to be static-free and has a thickness of approximately 1 mm.

With such a configuration, the U-shaped plate 12 may be prevented from deforming and may be able to maintain a flat plane structure.

By using such a U-shaped plate 12, the semiconductor wafer 1 with reduced thickness may be safely stored without being damaged or broken, for example.

Referring back to FIG. 4, the spring member 14 is arranged between two opposing U-shaped plates 12A positioned at a lower side and an upper side. The spring member 14 includes a plate portion 14a, an arc spring portion 14b positioned at one long side end of the plate portion 14a, and a clamper portion 14c positioned at the other long side end of the plate portion 14a.

The arc spring portion 14b is arranged on the surface of the lower side U-shaped plate 12, the plate portion 14a extends above the semiconductor wafer 1 arranged on this lower side U-shaped plate 12, and the damper portion 14c is fixed to the bottom face of the upper side U-shaped plate 12.

The spring member 14 may be a resin spring or a metal plate spring that is processed to be static-free and has a thickness of approximately 0.2 mm. When an external force is not applied to the storage case 10A, namely, when the storage case 10A is not compressed, the spring member 14 separates the two opposing U-shaped plates 12 from each other to enable insertion/removal of a semiconductor wafer 1 into/from the space between the U-shaped plates 12.

In other words, when the storage case 10A is expanded as is shown in FIG. 3, the plural U-shaped plates 12 arranged between the case upper plate 15a and the case lower plate 15b are separated from each other by the spring members 14 so that adequate space is created between the U-shaped plates 12. In this case, a semiconductor wafer 1 supported and carried by a wafer carrying arm (not shown) may be inserted through a semiconductor wafer insertion opening S of the storage case 10A. In this way, the bottom face (ground face) of the semiconductor wafer 1 may come into contact and be supported by the U-shaped plate 12 as is shown in FIG. 4.

After a desired number of semiconductor wafers 1 are stored in the storage case 10A, an external pressing force in vertical directions is applied to the case upper plate 15a and the case lower plate 15b so that the storage case 10A is compressed.

Figure 6:
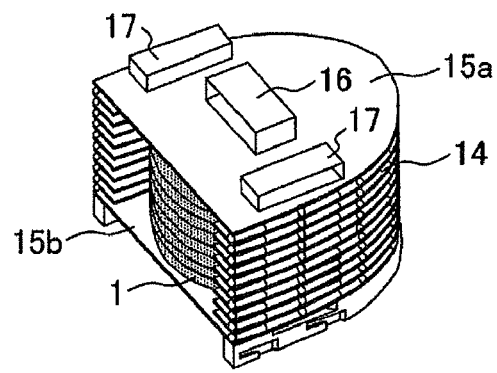
FIG. 6 is a perspective view of the semiconductor wafer storage case according to the first embodiment when it is compressed.
Figure 7:
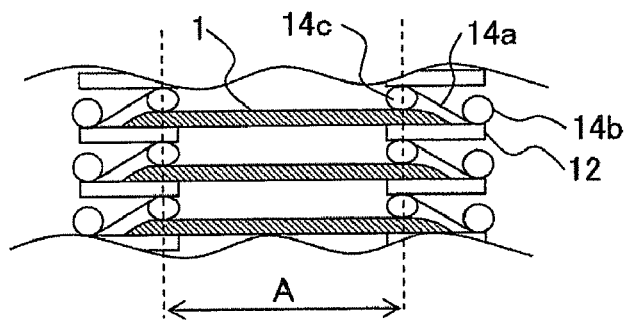
FIG. 7 is a cross-sectional view of the semiconductor wafer storage case according to the first embodiment when it is compressed.

FIGS. 6 and 7 are diagrams showing the storage case 10A having semiconductor wafers 1 stored therein and being compressed by an external pressing force.

Specifically, FIG. 6 is a perspective view of the storage case 10A when it is compressed, and FIG. 7 is a cross-sectional view of the storage case 10A in the compressed state as shown in FIG. 6.

As can be appreciated from these drawings, when the storage case 11A is compressed, the arc spring portion 14b elastically deforms, and the plate portion 14b and the damper portion 14c move toward the semiconductor wafer 1. In this way, the damper portion 14c comes into contact with the surface of the semiconductor wafer 1 at a location distanced away from the peripheral edge of the semiconductor wafer 1 by a predetermined distance W (e.g., 1 mm) to press the semiconductor wafer 1 toward the lower side U-shaped plate 12.

It is noted that the distance A (see FIG. 7) between opposing damper portions 14c on the left and right hand sides of the drawing may be arranged to be 150 mm when the storage case 10A is for storing a 6-inch wafer, 196 mm when the storage case 10A is for storing an 8-inch wafer, and 298 mm when the storage case 10A is for storing a 12-inch wafer, for example.

As is shown in FIGS. 3 and 4, the side wall of the storage case 10A is formed by stacking plural U-shaped plates 12 and plural spring members 14 at predetermined intervals.

Upon storing the semiconductor wafer 1 in the storage case 10A, the space between the U-shaped plates 12 arranged within the case upper plate 15a and the case lower plate 15b are expanded by the spring members 14. It is noted that the U-shaped plates 12 are made of relatively rigid material so that they may not deform and may be able to maintain their flat plane structures. Accordingly, even a semiconductor wafer 1 with reduced thickness may be safely stored without being damaged or broken, for example.

Figure 8:
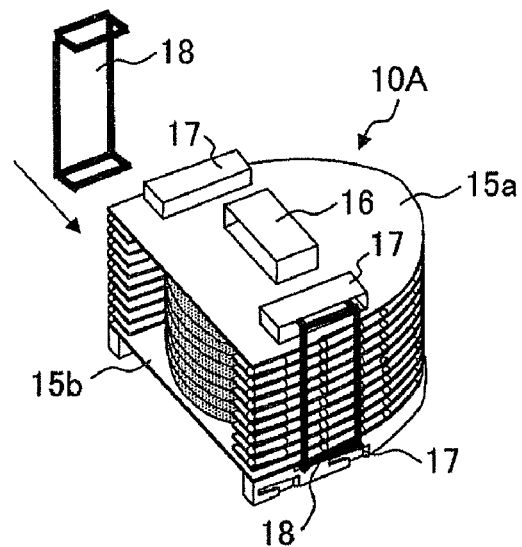
FIG. 8 is a perspective view of the semiconductor wafer storage case according to the first embodiment when it is compressed and fixed in the compressed state.

FIG. 8 is a diagram showing the storage case 10A when it is compressed and fixed in the compressed state.

Specifically, in this drawing, after compressing the storage case 10A, a clip 18 is arranged across the case upper plate 15a and the case lower plate 15b. By engaging the ends of the clip 18 with the expanded/compressed case fixing holes 17 arranged on the case upper plate 15a and the case lower plate 15b, expansion of the case upper plate 15a and the case lower plate 15b may be prevented. It is noted that the clip 18 may be made of resin or metal, for example.

In one embodiment, the storage case 10A having the semiconductor wafers 1 stored therein and compressed thereafter in the above-described manner may be accommodated inside a hermetic case upon being transported.

Figure 9A:
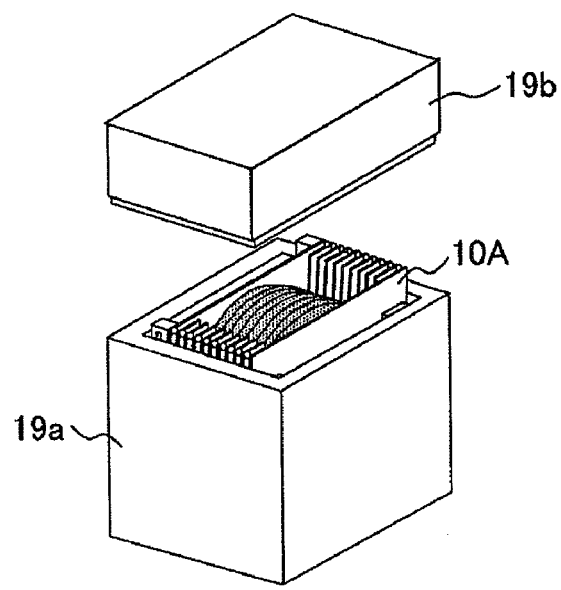
FIG. 9A is a perspective view of the compressed semiconductor wafer storage case shown in FIG. 8 being accommodated inside a hermetic case.
Figure 9B:
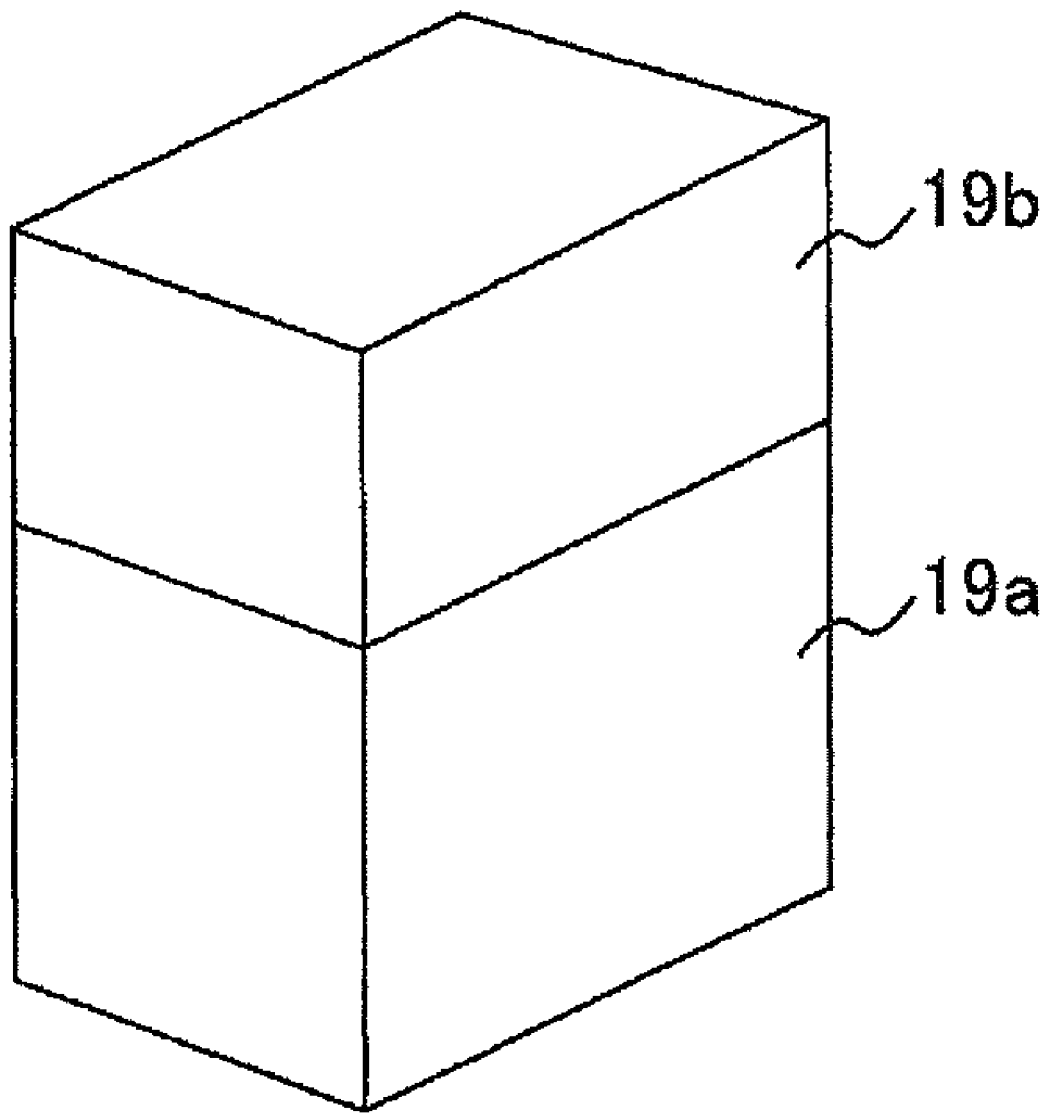
FIG. 9B is a perspective view of the hermetic case being sealed by a hermetic case lid.

FIG. 9A is a diagram showing the compressed storage case 10A shown in FIG. 8 being accommodated inside a hermetic case 19a. FIG. 9B is a diagram showing the hermetic case 19a being sealed by a hermetic case lid 19b.

Specifically, when taking the storage case 10A out of a clean room, for example, the storage case 10A may be accommodated inside the hermetic case 19a and sealed by the hermetic case lid 19b as shown in FIG. 9B.

Figure 10:
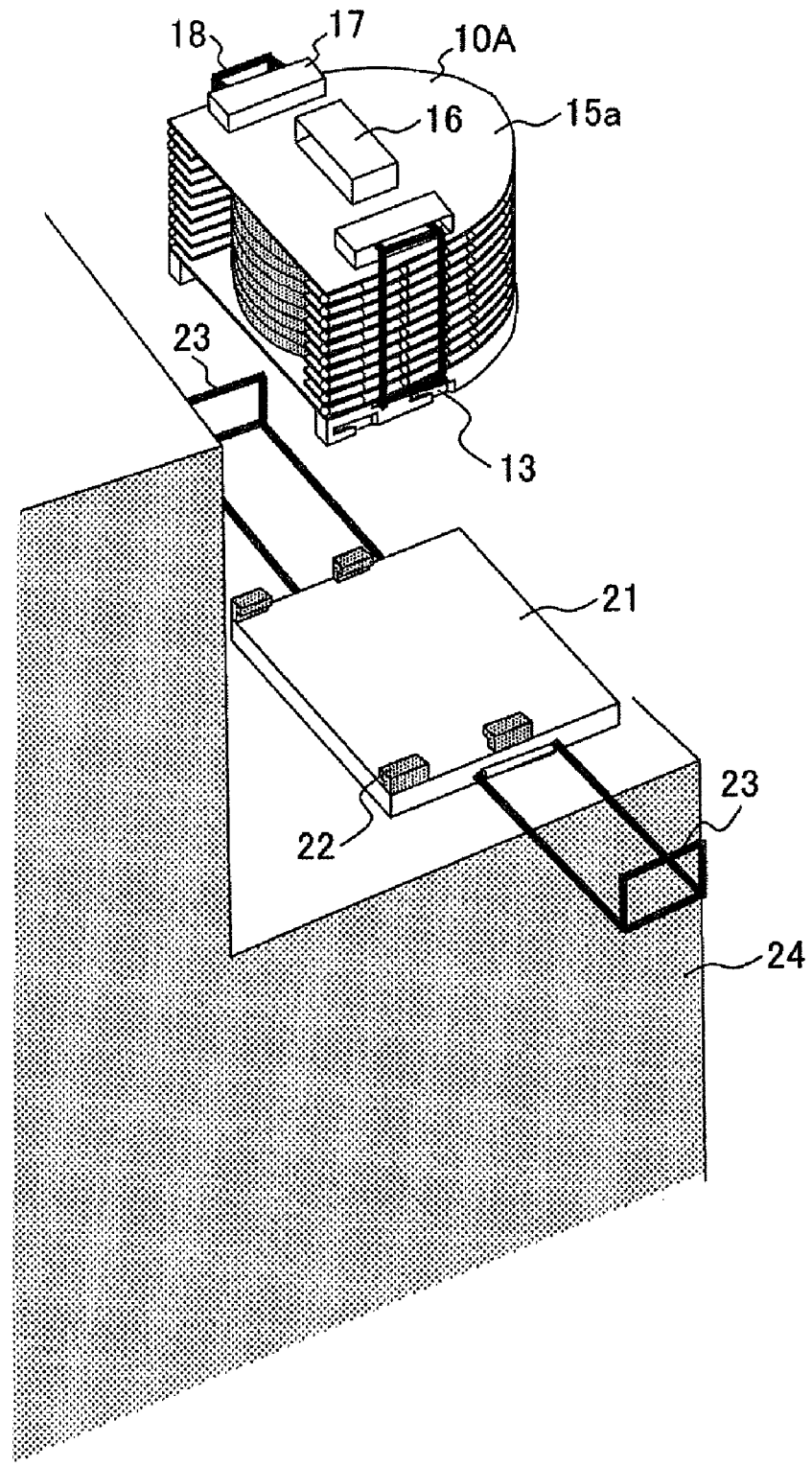
FIG. 10 is a diagram showing how the semiconductor wafer storage case according to the first embodiment is used in an apparatus.
Figure 11A:
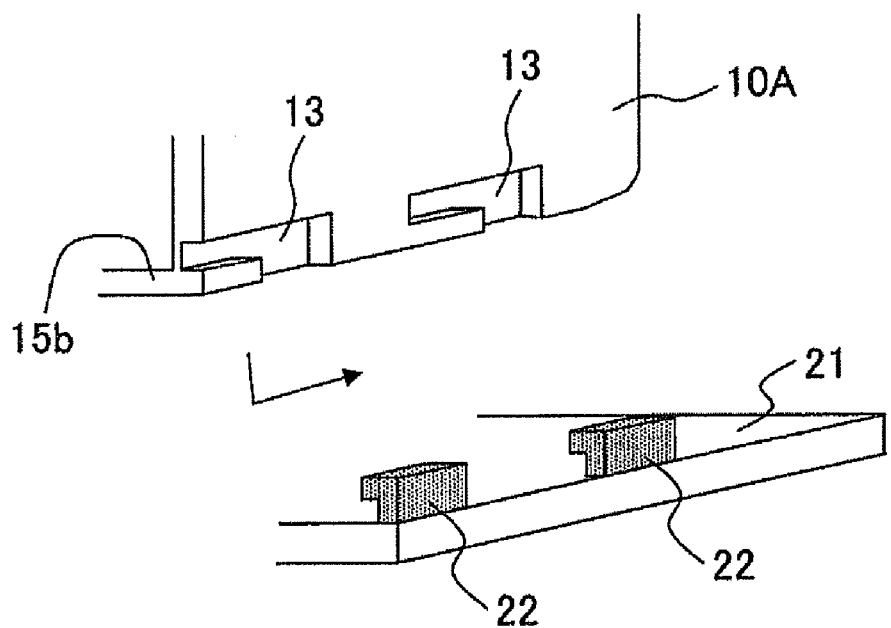
FIG. 11A is an enlarged view of a part of the semiconductor wafer storage case according to the first embodiment that is to be fixed to a case platform of the apparatus shown in FIG. 10.
Figure 11B:
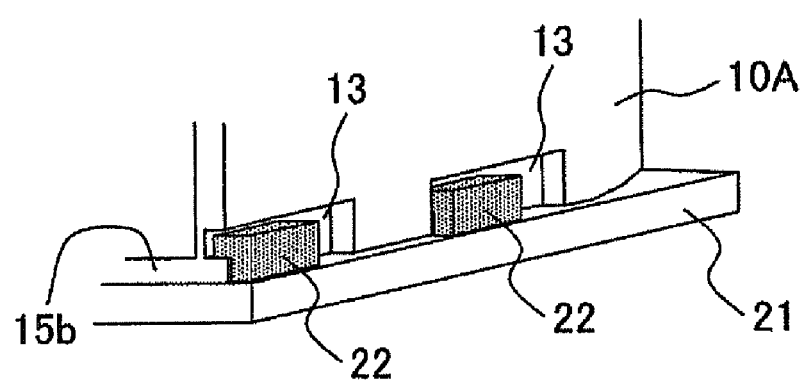
FIG. 11B is an enlarge view of the part of the semiconductor wafer storage case according to the first embodiment fixed to the case platform of the apparatus shown in FIG. 10.
Figure 12:
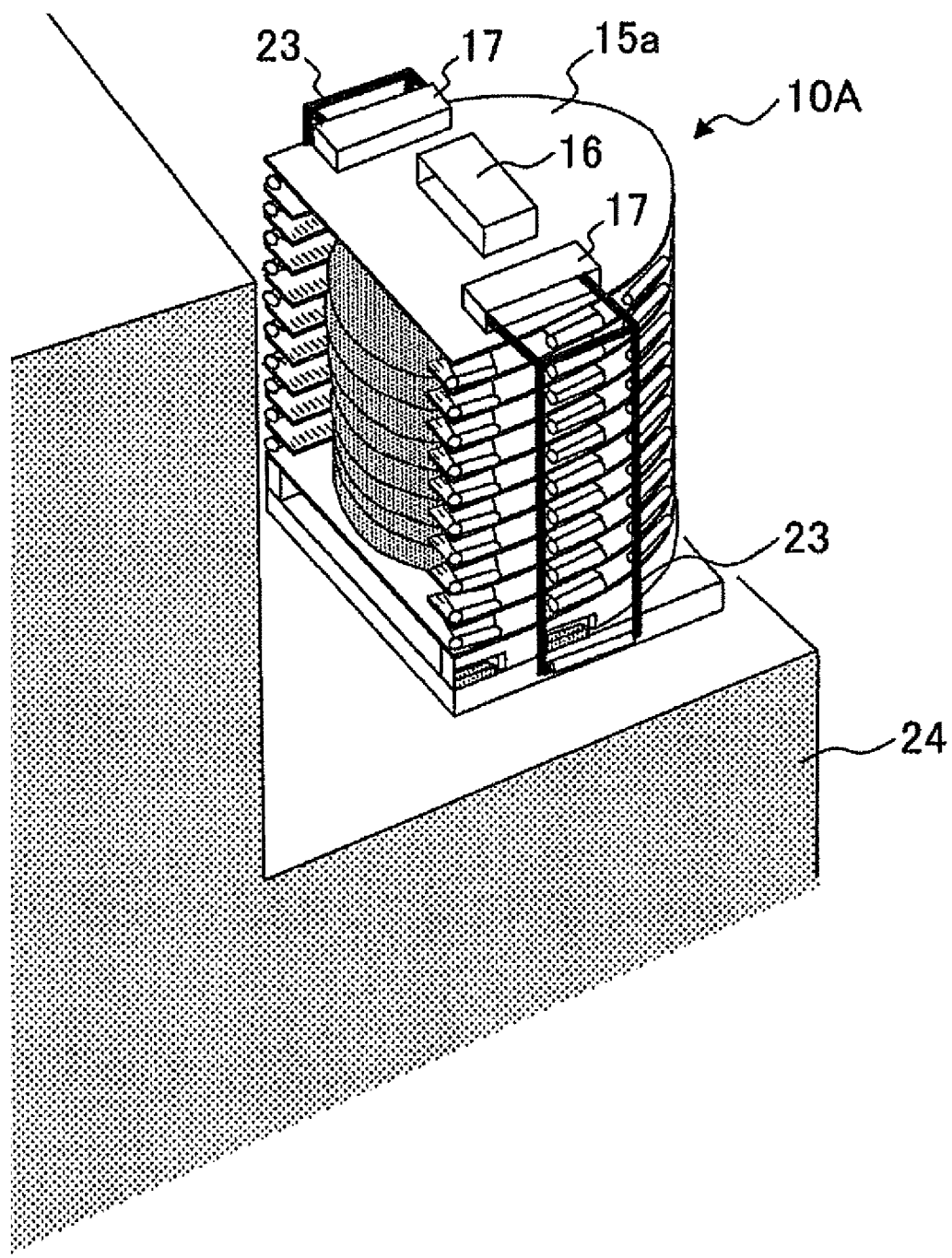
FIG. 12 is a diagram showing how the semiconductor wafer storage case according to the first embodiment is expanded after being fixed to the case platform of the apparatus shown in FIG. 10.

FIGS. 10-12 illustrate an exemplary case of utilizing the storage case 10A according to the present embodiment upon processing the semiconductor wafer 1 in a processing apparatus.

FIG. 10 is a diagram showing how the storage case 10A is used in an apparatus 24.

The illustrated apparatus 24 is a wafer carrying unit including an automated carrying mechanism such as a carrying robot (not shown) for removing a semiconductor wafer 1 to be processed out of the storage case 10A or accommodating the semiconductor wafer in the storage case 10A after the semiconductor wafer 1 is processed at a processing apparatus (not shown) configured to perform processes, such as etching or vapor phase epitaxy, on the semiconductor wafer 1.

In the present example, the storage case 10A that is fixed in the compressed state as shown in FIG. 8 is placed on a case platform 21 of the apparatus 24, and the storage case 10A is slid so that the apparatus fixing holes 13 arranged on the bottom face of the case lower plate 15b may engage case fixing hooks 22 arranged on the case platform 21 as shown in FIGS. 11A and 11B. It is noted that expanded case fixing members 23 of the apparatus 24 having one of their ends engaging the case platform 21 (see FIG. 10) are not shown in FIGS. 11A and 11B.

Next, the clip 18 is detached from the storage case 10A so that the case 10A may be expanded. Then, as is shown in FIG. 12, the expanded case fixing members 23 are arranged to engage the expanded/compressed case fixing holes 17 that are arranged on the case upper plate 15a of the storage case 10A so that the storage case 10A may be fixed to the case platform 21 in the expanded state.

Then, the semiconductor wafer 1 may be carried out of the storage case 10A or carried into the storage case 10A by an automated carrying mechanism such as a robot (not shown).

In the following, a semiconductor wafer storage case 10B according to a second embodiment of the present invention is described with reference to FIGS. 13A through 15B.

Figure 13A:
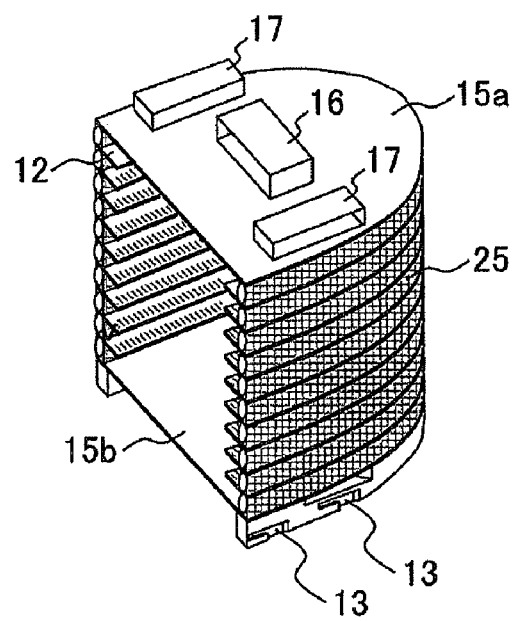
FIG. 13A is a perspective view of a semiconductor wafer storage case according to a second embodiment of the present invention when it is expanded.
Figure 13B:
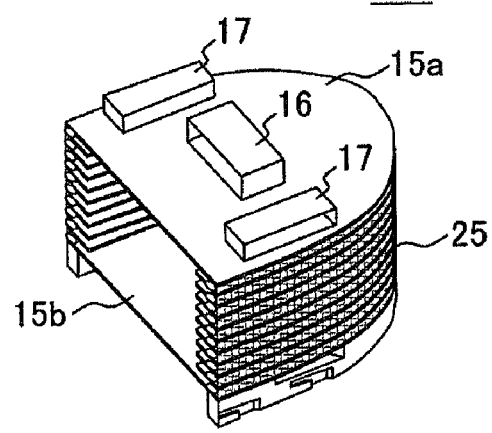
FIG. 13B is a perspective view of the semiconductor wafer storage case according to the second embodiment when it is compressed.

FIG. 13A is a perspective view of the storage case 10B according to the second embodiment when it is expanded, and FIG. 13B is a perspective view of the storage case 10B when it is compressed.

Figure 14A:
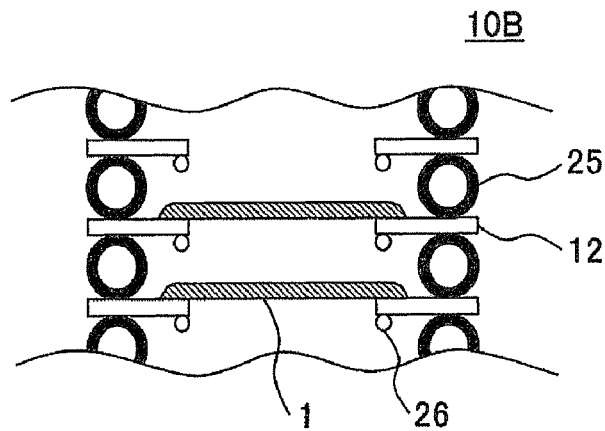
FIG. 14A is a cross-sectional view of the semiconductor wafer storage case according to the second embodiment in the expanded state as shown in FIG. 13A.
Figure 14B:
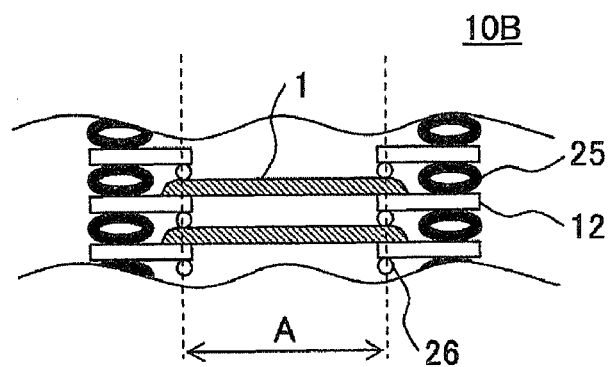
FIG. 14B is a cross-sectional view of the semiconductor wafer storage case according to the second embodiment in the compressed state as shown in FIG. 13B.

FIG. 14A is a cross-sectional view of the storage case 10B in the expanded state as shown in FIG. 13A, and FIG. 14B is a cross-sectional view of the storage case 10B in the compressed state as shown in FIG. 13B.

Figure 15A:
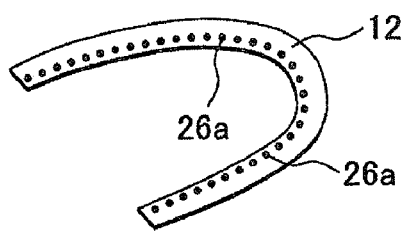
FIG. 15A is a diagram showing an exemplary arrangement of clampers on a U-shaped plate used in the semiconductor wafer storage case according to the second embodiment.
Figure 15B:
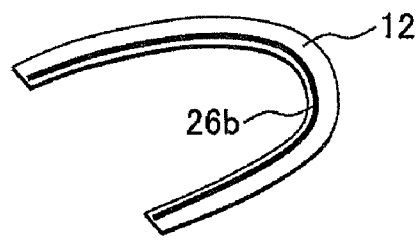
FIG. 15B is another exemplary arrangement of a damper on the U-shaped plate used in the semiconductor wafer storage case according to the second embodiment.

FIG. 15A is a diagram showing an exemplary arrangement of clampers on the U-shaped plate 12 according to one specific embodiment, and FIG. 15B is another exemplary arrangement of a damper on the U-shaped plate 12 according to another specific embodiment.

The storage case 10B of the second embodiment differs from the storage case 10A of the first embodiment in that it uses a circular tube 25 as an elastic member instead of the spring member 14.

Specifically, as is shown in FIGS. 14A and 14B, plural U-shaped plates 12 as semiconductor wafer support members are coupled to each other and supported by circular tubes 25 that are arranged along the U-shape periphery of the U-shaped plates 12. It is noted that when the storage case 10B is not compressed, the space between the U-shaped plates 12 may be arranged to be approximately 5 mm, for example.

It is noted that the linear portions and curved portions of the U-shaped plates 12 may be substantially sealed depending on the number of circular tubes 25 arranged between the U-shaped plates 12. Also, in one embodiment, the circular tube 25 may be one continuous tube that extends along the periphery of the U-shaped plate 12.

The circular tube 25 is an elastic member that is made of elastic material such as rubber.

The storage case 10B according to the present embodiment has one or more clampers 26 arranged along the inner perimeter side bottom surface of the U-shaped plate 12. The damper 26 is made of elastic material such as urethane or silicon rubber and are bonded and fixed to the U-shaped plate 12.

In one specific embodiment, plural clampers 26a may be dotted along the inner side perimeter of the U-shaped plate 12 as is shown in FIG. 15A. In another specific embodiment, one continuous damper 26b may be arranged along the inner side perimeter of the U-shaped plate 12 as is shown in FIG. 15B.

When no external pressing force is applied to the storage case 10B, the circular tube 25 separates two opposing U-shaped plates 12 from each other to enable insertion and removal of a semiconductor wafer 1.

Specifically, when the storage case 10B is expanded as shown in FIG. 14A, the distance between the U-shaped plates 12 is extended by the circular tube 25 so that adequate space is created between the U-shaped plates 12. In this way, a semiconductor wafer 1 supported by a wafer carrying arm (not shown) may be inserted into the space between the U-shaped plates 12 so that the bottom face of the semiconductor wafer 1 comes into contact with the lower side U-shaped plate 12.

When an external pressing force in vertical directions is applied to the case upper plate 15a and the case lower plate 15b to cause compression of the storage case 10B as shown in FIG. 14B, the clampers 26 are pressed onto the surface (patterned face) of the semiconductor wafer 1 and the semiconductor wafer 1 is held between the clamper 26 and the U-shaped plate 12.

It is noted that the distance A (see FIG. 14B) between opposing clampers 26 at the left and right hand sides of the drawing may be arranged to be the same as the distance A between the damper portions 14c of the storage case 10A according to the first embodiment. Specifically, the distance A may be arranged to be 150 mm when the storage case 10B is for storing a 6-inch wafer, 196 mm when the storage case 10B is for storing an 8-inch wafer, and 298 mm when the storage case 10B is for storing a 12-inch wafer, for example.

Also, it is noted that the storage case 10B according to the present embodiment may be transported or used for processing a semiconductor wafer 1 at a processing apparatus in a manner similar to the way the storage case 10A according to the first embodiment is transported or used as is described above.

In the following, a semiconductor wafer storage case 10C according to a third embodiment of the present invention is described with reference to FIGS. 16A-17B.

Figure 16A:
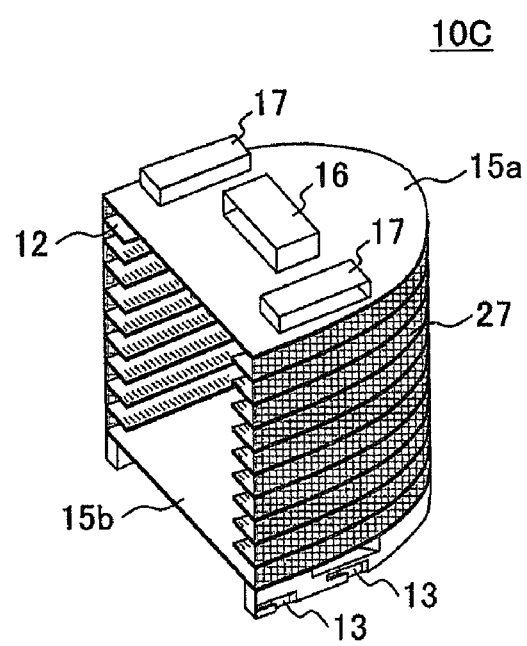
FIG. 16A is a perspective view of a semiconductor wafer storage case according to a third embodiment of the present invention when it is expanded.
Figure 16B:
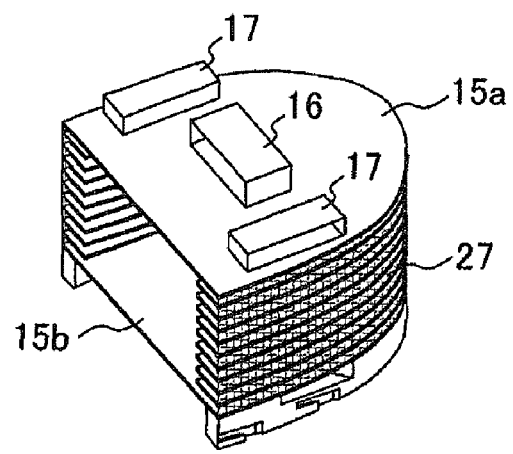
FIG. 16B is a perspective view of the semiconductor wafer storage case according to the third embodiment when it is compressed.

FIG. 16A is a perspective view of the storage case 10C according to the third embodiment when it is expanded, and FIG. 16B is a perspective view of the storage case 10C when it is compressed.

Figure 17A:
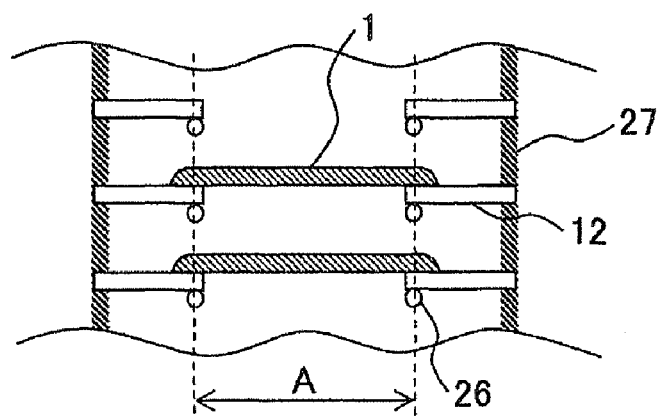
FIG. 17A is a cross-sectional view of the semiconductor wafer storage case according to the third embodiment in the expanded state as shown in FIG. 16A.
Figure 17B:
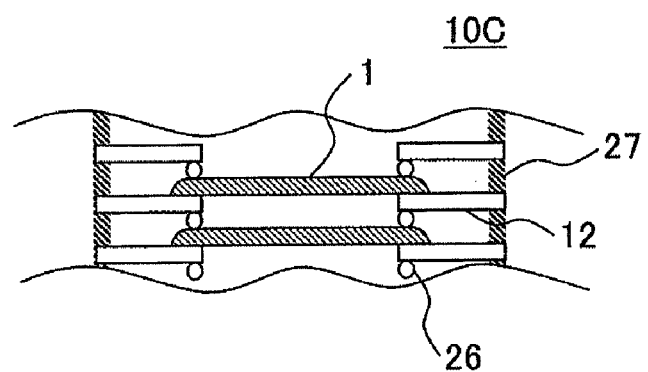
FIG. 17B is a cross-sectional view of the semiconductor wafer storage case according to the third embodiment in the compressed state as shown in FIG. 16B.

FIG. 17A is a cross-sectional view of the storage case 10C in the expanded state as shown in FIG. 16A, and FIG. 17B is a cross-sectional view of the storage case 10C in the compressed state as shown in FIG. 16B.

The storage case 10C according to the third embodiment differs from the previously-described embodiments in that it uses a rubber plate member 27 as the elastic member.

Specifically, as is shown in FIG. 16A, in the storage case 10C according to the third embodiment, plural U-shaped plates 12 as semiconductor wafer support members are held together and supported by a rubber plate member 27 that is arranged along the U-shape periphery of the U-shaped plates 12. When the storage case 10C is not compressed, the distance between the U-shaped plates 12 may be arranged to be approximately 5 mm, for example.

In certain embodiments, the linear portions and curved portions of the U-shaped plates 12 may be substantially sealed depending on the number of the rubber plate members 27 arranged at the periphery of the U-shaped plated 12. In one specific embodiment, the rubber plate member 27 may be one continuous plate member surrounding the periphery of the U-shaped plates 12 of the storage case 10C.

The storage case 10C according to the present embodiment has one or more clampers 26 arranged at the inner side bottom faces of the U-shaped plates 12. The damper 26 is made of elastic material such as urethane or silicon rubber and is bonded and fixed to the U-shaped plates 12.

In one specific embodiment, plural clampers 26a may be dotted along the inner side perimeter of the U-shaped plate 12 as is shown in FIG. 15A. In another specific embodiment, a continuous damper 26b may be arranged along the inner side perimeter of the U-shaped plate 12 as is shown in FIG. 15B.

When no external pressing force is applied to the to the case upper plate 15a and the case lower plate 15b, namely, when the storage case 10C is not compressed, the rubber plate member 27 separates two opposing U-shaped plates 12 from each other to enable insertion/removal of a semiconductor wafer 1 into/from the space between the U-shaped plates 12.

Specifically, when the storage case 10C is expanded as shown in FIG. 17A, the distance between the U-shaped plates 12 is extended by the rubber plate member 27 so that adequate space is created between the U-shaped plates 12. In this way, a semiconductor wafer 1 supported by a wafer carrying arm (not shown) may be inserted into the space between the U-shaped plates 12 so that the bottom face (ground face) of the semiconductor wafer 1 comes into contact with the surface of the lower side U-shaped plate 12 as shown in FIG. 17A.

When an external pressing force in vertical directions is applied to the case upper plate 15a and the case lower plate 15b to cause compression of the storage case 10C as shown in FIG. 17B, the damper 26 is pressed onto the surface (patterned face) of the semiconductor wafer 1 so that the semiconductor wafer 1 may be held between the U-shaped plates 12.

As with the previously-described embodiments, the distance A (see FIG. 17A) between opposing clampers 26 on the left and right hand sides of the drawing may be arranged to be 150 mm when the storage case 10C is for storing a 6-inch wafer, 196 mm when the storage case 10C is for storing an 8-inch wafer, and 298 mm when the storage case 10C is for storing a 12-inch wafer, for example.

It is noted that the storage case 10C according to the present embodiment having the above-described configuration may be capable of being compressed at a higher compression rate without inflicting damage on the semiconductor wafer 1.

Also, the height of the storage case 10C according to the present embodiment may be reduced compared to that of the storage case 4 shown in FIG. 10C so that its storage space may be reduced.

Also, the storage case 10C according to the present embodiment may be transported or utilized for processing a semiconductor wafer 1 at a processing apparatus in a manner similar to the way the storage case 10A according to the first embodiment is transported or used as described above.

In the following, a semiconductor wafer storage case 10D according to a fourth embodiment of the present invention is described with reference to FIGS. 18A-20B.

Figure 18A:
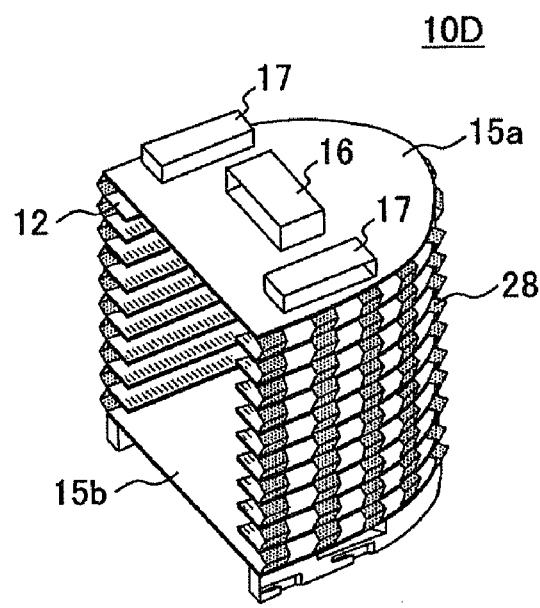
FIG. 18A is a perspective view of a semiconductor wafer storage case according to a fourth embodiment of the present invention when it is expanded.
Figure 18B:
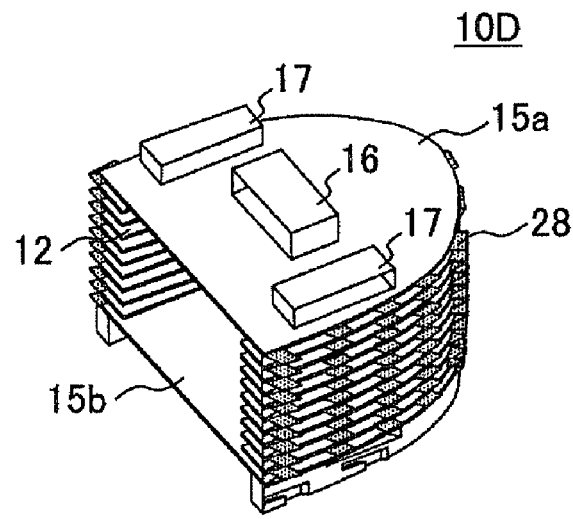
FIG. 18B is a perspective view of the semiconductor wafer storage case according to the fourth embodiment when it is compressed.

FIG. 18A is a perspective view of the storage case 10D according to the fourth embodiment when it is expanded, and FIG. 18B is a perspective view of the storage case 10D when it is compressed.

Figure 19A:
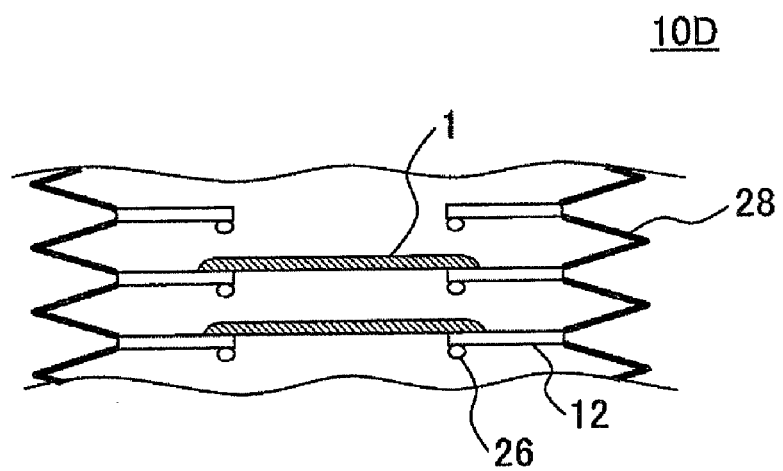
FIG. 19A is a cross-sectional view of the semiconductor wafer storage case according to the fourth embodiment in the expanded state as shown in FIG. 18A.
Figure 19B:
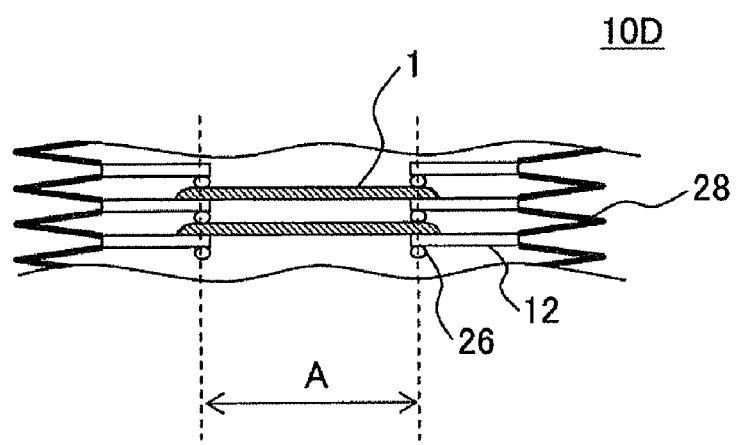
FIG. 19B is a cross-sectional view of the semiconductor wafer storage case according to the fourth embodiment in the compressed state as shown in FIG. 18B.

FIG. 19A is a cross-sectional view of the storage case 10D in the expanded state as shown in FIG. 18A, and FIG. 19B is a cross-sectional view of the storage case 10D in the compressed state as shown in FIG. 18B.

Figure 20A:
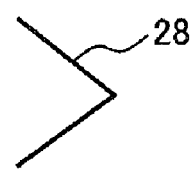
FIG. 20A is a diagram showing a spring member of the semiconductor wafer storage case according to the fourth embodiment when it is open.
Figure 20B:
FIG. 20B is a diagram showing the spring member of the semiconductor wafer storage case according to the fourth embodiment when it is closed.

FIG. 20A shows a spring member of the storage case 10D when it is open, and FIG. 20B shows the spring member of the storage case 10D when it is closed.

In the storage case 10D according to the present embodiment, a V-shaped spring member 28 is used as an elastic member instead of the spring member 14 of the first embodiment.

Specifically, as is shown in FIGS. 19A and 19B, the storage case 10D according to the present embodiment has plural U-shaped plates 12 as semiconductor wafer support members coupled to each other and supported by plural V-shaped spring members 28 that are arranged along the U-shape periphery of the U-shaped plates 12. When the storage case 10D is not compressed, the distance between the U-shaped plates 12 may be arranged to be approximately 5 mm, for example.

In certain embodiments, the linear portions and curved portions of the U-shaped plates 12 may be substantially sealed depending on the number of V-shaped spring members 28 arranged along the U-shape periphery of the U-shaped plates 12.

It is noted that the V-shaped spring member 28 may be made of SUS304CSP having a thickness of approximately 0.1-0.3 mm, for example.

The storage case 10D according to the present embodiment has one or more clampers 26 arranged at the inner side bottom faces of the U-shaped plates 12. The clamper 26 may be made of elastic material such as urethane or silicon rubber and is bonded and fixed to the U-shaped plates 12.

In one specific embodiment, plural clampers 26a may be dotted along the inner side perimeter of the U-shaped plate 12 as is shown in FIG. 15A. In another specific embodiment, a continuous clamper 26b may be arranged along the inner side perimeter of the U-shaped plate 12 as is shown in FIG. 15B.

When no external pressing force is applied to the to the case upper plate 15a and the case lower plate 15b, namely, when the storage case 10D is not compressed, the V-shaped spring member 28 separates two opposing U-shaped plates 12 from each other to enable insertion/removal of a semiconductor wafer 1 into/from the space between the U-shaped plates 12.

Specifically, when the storage case 10D is expanded as shown in FIG. 19A, the distance between the U-shaped plates 12 is extended by the V-shaped spring member 28 so that adequate space is created between the U-shaped plates 12. In this way, a semiconductor wafer 1 supported by a wafer carrying arm (not shown) may be inserted into the space between the U-shaped plates 12 so that the bottom face (ground face) of the semiconductor wafer 1 comes into contact with the surface of the lower side U-shaped plate 12 as shown in FIG. 19A.

When an external pressing force in vertical directions is applied to the case upper plate 15a and the case lower plate 15b to cause compression of the storage case 10D as shown in FIG. 19B, the damper 26 is pressed onto the surface (patterned face) of the semiconductor wafer 1 so that the semiconductor wafer 1 may be held between the U-shaped plates 12.

As with the previously-described embodiments, the distance A (see FIG. 19B) between opposing clampers 26 on the left and right hand sides of the drawing may be arranged to be 150 mm when the storage case 10C is for storing a 6-inch wafer, 196 mm when the storage case 10C is for storing an 8-inch wafer, and 298 mm when the storage case 10C is for storing a 12-inch wafer, for example.

Also, the storage case 10D according to the present embodiment may be transported or utilized for processing a semiconductor wafer 1 at a processing apparatus in a manner similar to the way the storage case 10A according to the first embodiment is transported or used as described above.

In one embodiment, the V-shaped spring member 28 may normally be open as shown in FIG. 20A. In another embodiment, the V-shaped spring member 28 may normally be closed as shown in FIG. 20B.

In the case where the V-shaped spring member 28 is normally closed, the pressure and speed for compressing the storage case 10D may be adjusted so that a semiconductor wafer may be prevented receiving shock and be protected from damage. On the other hand, in the case where the V-shaped spring member 28 is normally closed, a semiconductor wafer may be securely held between the U-shaped plates 12 on a constant basis so that the semiconductor wafer may be prevented from falling when it is being transported within the storage case 10D.

In the following, a semiconductor wafer storage case 10E according to a fifth embodiment of the present invention is described with reference to FIGS. 21A-23B.

Figure 21A:
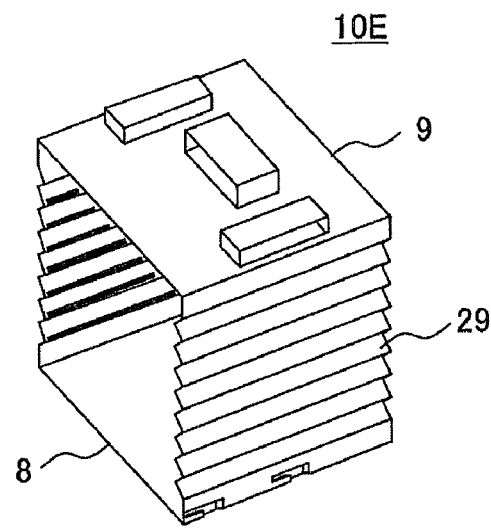
FIG. 21A is a front side perspective view of a semiconductor wafer storage case according to a fifth embodiment of the present invention when it is expanded.
Figure 21B:
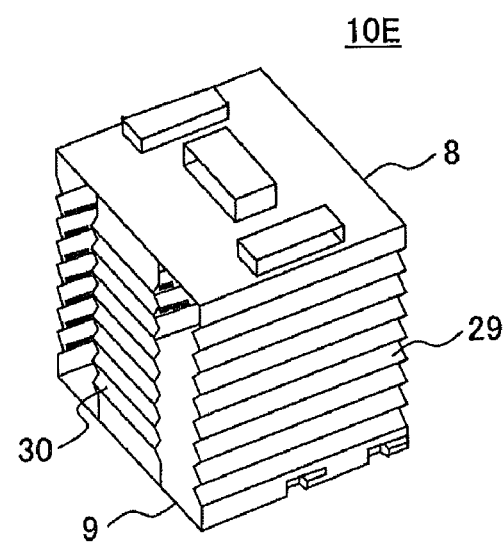
FIG. 21B is a rear side perspective view of the semiconductor wafer storage case according to the fifth embodiment when it is expanded.
Figure 21C:
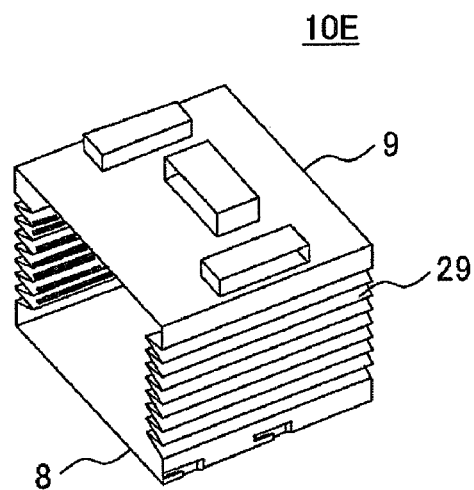
FIG. 21C is a front side perspective view of the semiconductor wafer storage case according to the fifth embodiment when it is compressed.

FIG. 21A is a front side perspective view of the storage case 10E when it is expanded, and FIG. 21B is a rear side perspective view of the storage case 10E when it is expanded. FIG. 21C is a front side perspective view of the storage case 10E when it is compressed.

Figure 22A:
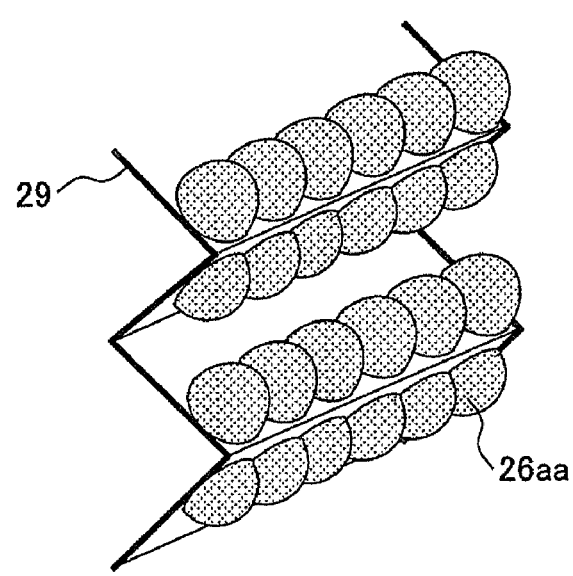
FIG. 22A is a diagram showing an exemplary configuration of clampers used in the semiconductor wafer storage case according to the fifth embodiment.
Figure 22B:
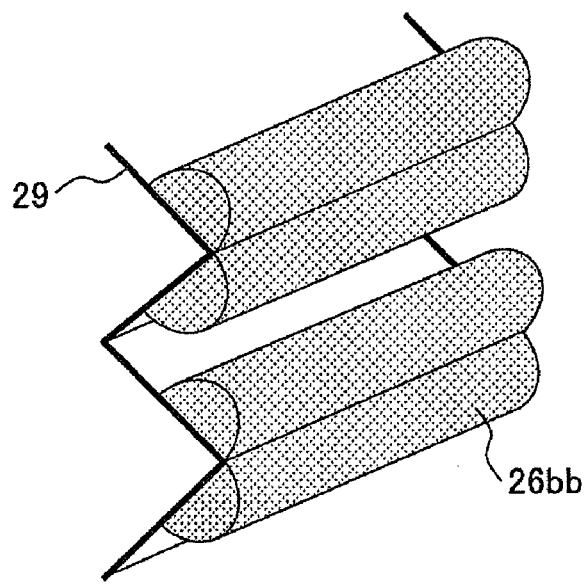
FIG. 22B is a diagram showing another exemplary configuration of clampers used in the semiconductor wafer storage case according to the fifth embodiment.

FIG. 22A is a diagram showing a configuration of clampers used in the storage case 10E according to one specific embodiment, and FIG. 22B is a diagram showing a configuration of clampers used in the storage case 10E according to another specific embodiment.

Figure 23A:
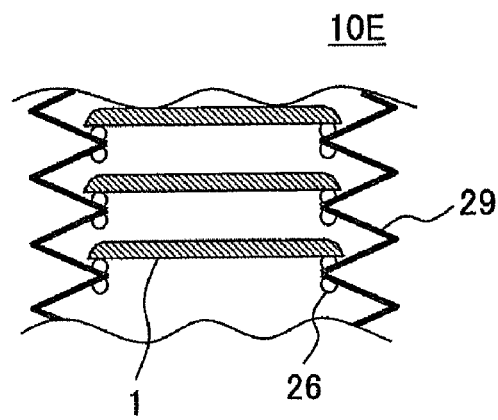
FIG. 23A is a cross-sectional view of the semiconductor wafer storage case according to the fifth embodiment when it is expanded.
Figure 23B:
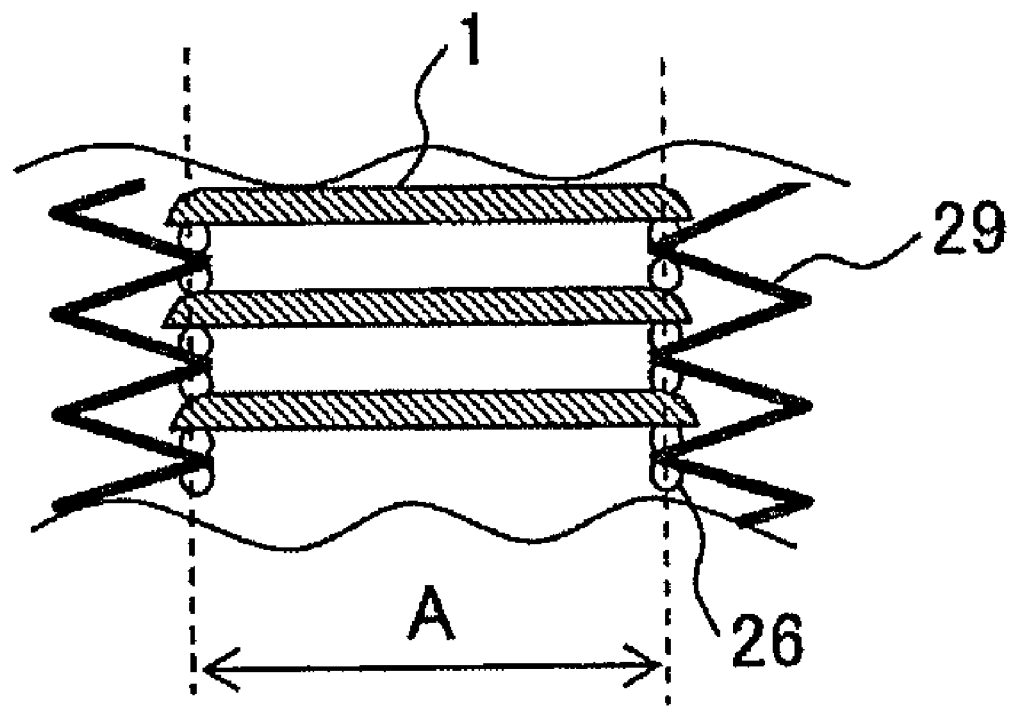
FIG. 23B is a cross-sectional view of the semiconductor wafer storage case according to the fifth embodiment when it is compressed.

FIG. 23A is a cross-sectional view of the storage case 10E when it is expanded, and FIG. 23B is a cross-sectional view of the storage case 10E when it is compressed.

The storage case 10E according to the present embodiment differs from the previously-described embodiments in that it does not use the U-shaped plates 12 as the semiconductor support members.

Specifically, as is shown in FIGS. 21A-21C, the storage case 10E according to the present embodiment includes a continuous V-shaped spring member 29 that is used as the semiconductor wafer support member as well as the elastic member. In other words, the storage case 10E is arranged into a concertina structure like the storage case 4 shown in FIG. 1C.

When no external pressing force is applied to the continuous V-shaped spring member 29, namely, when the storage case 10E is not compressed as shown in FIG. 21A, bent portions of the continuous V-shaped spring member 29 are arranged at intervals of approximately 5 mm.

It is noted that the continuous V-shaped spring member 29 may be made of synthetic resin material such as polyethylene, terephthalate, or polypropylene, for example.

As is shown in FIGS. 23A and 23B, the storage case 10E according to the present embodiment has clampers 26 arranged on the inner sides of the bent portions of the continuous V-shaped spring member at upper and lower positions of protruding ends of the bent portions of the continuous V-shaped spring member 29.

In one specific embodiment, plural clampers 26aa may be dotted along corresponding upper and lower positions of the protruding ends of the bent portions as is shown in FIG. 22A. In another specific embodiment, continuous clampers 26bb may be arranged along corresponding upper and lower positions of the protruding ends of the bent portions as is shown in FIG. 22B.

When no external pressing force is applied, namely, when the storage case 10E is not compressed, the continuous V-shaped spring member 29 is expanded to create a relatively large space to enable insertion/removal of a semiconductor wafer 1.

Specifically, when the continuous V-shaped spring member 29 is expanded as shown in FIG. 23A, the distance between the bent portions of the continuous V-shaped spring member 29 is expanded (i.e., the bent portion is expanded to form a widened V-shape) so that adequate space is created between the bent portions. In this way, a semiconductor wafer 1 supported by a wafer carrying arm (not shown) may be inserted into the space formed by the bent portions and the semiconductor wafer 1 may be supported by the bent portions with its bottom face (ground face) being held in contact with corresponding clampers 26 arranged at the bent portions.

When an external pressing force in vertical directions is applied to the case upper plate 15a and the case lower plate 15b (not shown) to cause compression of the storage case 10E as shown in FIG. 23B, the clampers 26 are pressed onto the surface (patterned face) and bottom face (ground face) of the semiconductor wafer 1 so that the semiconductor wafer 1 may be held in place between the bent portions of the continuous V-shaped spring member 29.

In this case, the clampers 26 positioned on top of the semiconductor wafer 1 comes into linear contact or point contact with the surface of the semiconductor wafer 1 at a position located at least 1 mm inward from the peripheral edge of the semiconductor wafer 1. In other words, the storage case 10E according to the present embodiment is configured such that its continuous V-shaped spring member 29 and clampers 26 may be prevented from coming into contact with the peripheral edge of the semiconductor wafer 1.

Accordingly, even when a semiconductor wafer 1 with reduced thickness is inserted into the storage case 10E, the semiconductor wafer 1 may be safely stored without being damaged or broken. Specifically, by arranging the clampers 26 at the upper and lower positions of the protruding ends of the bent portions of the continuous V-shaped spring member 29 to come into contact with near edge regions on the upper and lower faces of the semiconductor wafer as opposed to its peripheral edge, the semiconductor wafer may be prevented from breaking or being damaged.

It is noted that the storage case 10E according to the present embodiment may be transported or utilized for processing a semiconductor wafer 1 at a processing apparatus in a manner similar to the way the storage case 10A according to the first embodiment is transported or used as described above.

As can be appreciated from the above descriptions, the storage cases 10A-10D according to the first through fourth embodiments of the present invention have plural U-shaped plates 12 and elastic members (e.g., spring member 14, circular tube 25, rubber plate member 27, V-shaped spring member 28) stacked at predetermined intervals.

According to an aspect of the above embodiments, the U-shaped plates 12 made of rigid material are prevented from deforming and are able to maintain a flat plane structure so that even a semiconductor wafer 1 with reduced thickness may be safely stored without being damaged or broken, for example.

According to another aspect of the above embodiments, the U-shaped plates 12 are arranged to have external dimensions that are greater than those of the semiconductor wafer 1 and the rear side shape of the U-shaped plates 12 is arranged in accordance with the shape of the semiconductor wafer 1 so that the storage space of the storage cases 10A-10C may be reduced compared to the conventional storage case 4.

The storage case 10E according to the fifth embodiment of the present invention has a concertina structure and uses a continuous V-shaped spring member 29 that functions as the semiconductor wafer support member and the elastic member so that the storage case configuration may be simplified.

According to an aspect of the above embodiment, a semiconductor wafer stored inside such a concertina type storage case may be supported by clampers having elastic properties that are arranged to be in linear contact or point contact with near edge portions of the semiconductor wafer. In this way, even a semiconductor wafer with reduced thickness may be safely stored without being damaged or broken.

As can be appreciated from the above descriptions, in a semiconductor wafer storage case according to an embodiment of the present invention, the side wall portion of the semiconductor wafer storage case that comes into contact with a semiconductor wafer is arranged to come into contact with the upper and lower faces of the semiconductor wafer rather than the peripheral edge of the semiconductor wafer so that the semiconductor wafer being stored may be prevented from breaking or being damaged, for example. Also, a semiconductor wafer stored in a semiconductor wafer storage case according to an embodiment of the present invention may be prevented from breaking even when a pressing force in vertical directions is applied to the storage case to hold the semiconductor wafer in place. Thus, even a semiconductor wafer with reduced thickness may be reliably stored in a semiconductor wafer storage case according to an embodiment of the present invention.

It is noted that although the present invention is described above with respect to certain specific embodiments, the present invention is not limited to these embodiments, and variations and modifications may be made without departing from the scope of the present invention.

What is claimed is:

1. A semiconductor wafer storage case comprising:
    a plurality of support members that are spaced at predetermined intervals with respect to each other, each of which supporting members is in contact with a peripheral edge region of a bottom surface of a semiconductor wafer; and
    an elastic member arranged in each of the plurality of support members to elastically support a top surface of the semiconductor wafer on a corresponding one of the plurality of support members, the elastic member including a clamper to come into contact with an inner point of the top surface of the semiconductor wafer when the storage case is compressed and the corresponding one of the plurality of support members contacts the peripheral edge region of the bottom surface of the semiconductor wafer, the inner point of the top surface being located at a predetermined distance from a peripheral edge of the semiconductor wafer, said clamper pressing the inner point of the top surface of the semiconductor wafer onto the corresponding one of the plurality of support members.

2. The semiconductor wafer storage case as claimed in claim 1, wherein:
    the semiconductor wafer includes a circuit-patterned surface corresponding to the top surface of the semiconductor wafer.

3. The semiconductor wafer storage case as claimed in claim 1, wherein
    each of the plurality of supporting members is a flat plane member that is made of rigid resin or metal.

4. The semiconductor wafer storage case as claimed in claim 1, wherein
    each of the plurality of supporting members is a U-shaped plate made of resin or metal that is processed to be electrostatic-free.

* * * * *